United States Patent
Tsironis

(10) Patent No.: US 12,259,454 B1
(45) Date of Patent: Mar. 25, 2025

(54) ANTI-SKEWING IMPEDANCE TUNER CALIBRATION

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 315 days.

(21) Appl. No.: 17/871,316

(22) Filed: Jul. 22, 2022

(51) Int. Cl.
*G01R 35/00* (2006.01)
*G01R 27/32* (2006.01)

(52) U.S. Cl.
CPC .......... *G01R 35/005* (2013.01); *G01R 27/32* (2013.01)

(58) Field of Classification Search
CPC ..... H01P 5/04; H01P 1/00; H01P 5/18; G01R 27/32; G01R 31/2822; G01R 35/005; G01R 27/28; G01R 31/2601; G01R 31/2612; G01R 27/04; G01R 31/2614; G01R 1/26; G01R 1/06772; G01R 27/06; G01R 31/2607; G01R 31/3191; H03H 7/40; H03H 7/38; H03J 1/08; H03J 1/06; H03J 1/00; H03J 7/305; H04L 25/0204; H04L 25/0228; H04L 25/0278; H04L 25/03343; H04L 25/03891
See application file for complete search history.

(56) References Cited

U.S. PATENT DOCUMENTS 9,625,556 B1 * 4/2017 Tsironis ............. G01R 27/32

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner, CCMT", Product Note 41, Focus Microwaves Inc. 1998.
"Computer Controller Microwave Tuner, CCMT-5010 (1-50GHz)", Datasheet, Focus Microwaves Inc.
"High resolution Tuners eliminate Load Pull performance errors", Application Note 15, Focus Microwaves, Jan. 1995, pp. 6 and 7.

* cited by examiner

*Primary Examiner* — Lincoln D Donovan
*Assistant Examiner* — Tyler J Pereny

(57) ABSTRACT

A new method for calibrating slide screw tuners allows straightening the reflection factor phase response (anti-skewing); it uses a new scaling method and a new coordinate system of tuning probe control. The method is agnostic and self-regulating, it treats the tuner as a black box and depends on the test frequency. The method improve mathematical interpolation and tuning results using reduced number of calibration points and allows higher calibration speed.

3 Claims, 11 Drawing Sheets

ANTI-SKEWING IMPEDANCE TUNER CALIBRATION

PRIORITY CLAIM

Not Applicable

CROSS-REFERENCE TO RELATED ARTICLES

1. "Load Pull Measurements" [online], Wikipedia [Retrieved on 11/18/2016] Retrieved from Internet <URL.http://en.wikipedia.org/wiki/Load_pull>
2. "Computer Controlled Microwave Tuner—CCMT", Product Note 41, Focus Microwaves January 1998.
3. "Computer Controller Microwave Tuner, CCMT-5010 (1-50 GHz)", Datasheet, Focus Microwaves Inc.
4. Tsironis C., U.S. Pat. No. 9,625,556, "Method for Calibration and Tuning with Impedance Tuners".
5. "High resolution Tuners eliminate Load Pull performance errors", Application Note 15, Focus Microwaves, January 1995, pages 6 and 7.

BACKGROUND OF THE INVENTION

This invention relates to RF and microwave frequency testing of RF transistors using various test instruments and automatic electro-mechanical impedance tuners for various communication systems beyond the validity of numeric device models.

A popular method for testing and characterizing such microwave components (transistors) is "load pull" or "source pull" (see ref 1). Load/source pull is a measurement technique employing impedance tuners and other microwave test equipment as shown in FIG. 1. The microwave tuners 2, 4 are used in order to manipulate the microwave impedance conditions under which the DUT 3 is tested; the signal is provided by a signal source 1 and the outcoming power is measured by a power meter 5; the whole is controlled by a PC 6, which controls the instruments and the tuners using digital control cables 7, 8 and 9.

DESCRIPTION OF PRIOR ART

The impedance tuners used presently are, typically, "slide screw" (see ref. 2, 3): they use reflective tuning probes inserted into a slotted transmission airline (slabline) to create controlled reflection factors (impedances). The transmission line has a test port facing the DUT and an idle port, connected either with the load or with the source (FIG. 1). Ordinarily the slabline must allow the reflective tuning probe to move freely along its length for at least one half of a wavelength $(\lambda/2[mm] \approx 150/F[GHz])$ at the lowest frequency F of operation of the tuner. In the case of the anti-skewing calibration additional space must be allocated for the correcting horizontal probe move.

Further on we refer only to load tuners, but all definitions and considerations apply symmetrically to source tuners as well. The tuning probes (slugs) have the typical form shown in FIG. 2. The block (slug) body 21 has a concave semi-cylindrical bottom matching the shape of the, typically cylindrical, center conductor 23 of the slabline 24 and is attached to a holding rod 22 attached to a precision vertical axis controlled by a vertical stepper motor. The vertical axis moves the tuning probe (slug) 21 towards or away 26 from the center conductor 23 between a Top (withdrawal) and a Bottom (maximum penetration) position. This controls the amount of reflected signal from the signal injected into the slabline and thus the amplitude of the reflection factor, created by the tuning probe. An independent control mechanism moves the probe horizontally (X) along 25 the slabline. This controls the phase of the reflection factor 33 of the slug 32 relative to a reference test port 31 (FIG. 3). The Cartesian movement (X, Y) of the reflective tuning probe corresponds to an equivocal polar trajectory of the complex reflection factor $\Gamma=|\Gamma|*\exp(j\Phi)$ with $|\Gamma| \approx |\Gamma(Y)|$ and $\Phi=\Phi(X)$. Interpolation between calibration points and impedance synthesis (tuning) algorithms have, so far, been based on this specific coordinate system describing sufficiently the natural tuner behavior up to $|\Gamma|<0.9$.

Beyond $|\Gamma| \approx 0.7$ though, the trajectory of $|\Gamma|$ as a function of Y skews; at frequencies F below a certain value, which corresponds to the width 34 of the slug being shorter than a quarter wavelength $\lambda(F)/4$ they skew counter-clock wise and above a certain frequency clock-wise (FIG. 10); the threshold frequency Ft is when the width 34 of the tuning slug is equal to a quarter wavelength $(\lambda(Ft)/4)$; a disturbing distortion (skewing) of the reflection factor trajectory occurs when the reflective tuning probe (FIG. 2) moves very close to the center conductor (GAP $27 \approx 0$), in order to create high reflection factor $\Gamma$ (FIG. 10, 11).

BRIEF DESCRIPTION OF THE INVENTION

The invention introduces a new coordinate system for the control and positioning of the tuning probe, applicable to tuning slugs, in order to linearize the reflection factor trajectory. Instead of simple cartesian horizontal (X) and vertical (Y) probe movement control {X,Y} the new coordinate system introduces a new horizontal axis Z instead of X; it is obvious that the new coordinate Z, which depends on Y, deviates from X more when the probe approaches the center conductor (FIG. 10). To compensate for this trace deformation, the calibration routine determines and introduces a horizontal displacement of the tuning probe towards or away of the test port as a function of the actual frequency, the probe penetration and its distance from the center conductor. This horizontal correction is determined experimentally during the configuring scaling step (FIG. 6) of the calibration and the values are saved in the calibration file for each calibrated position of the tuning probe, using the format {X, Y, ΔX, Sij}, so that when plotting S11(X+ΔX,Y) the trace looks like trace 101 instead of originally trace 100 (FIG. 10).

"Tuning" in the context of this invention is the process of synthesizing physically a required reflection factor, or impedance, at the test port of the tuner and by extension at the DUT terminals, by properly calculating the necessary tuning probe coordinates and moving the probe to those coordinates. Given a time-imposed limited number of anchoring (calibration) points, tuning accuracy depends on how accurately an interpolation method can match the actually created s-parameters of the tuner for probe positions between calibrated points: this is best visualized by comparing target a (Xt,Yt) with the four adjacent points (Xm, Yn) in FIGS. 8 and 9. Interpolation is less accurate the more nonlinear (skewed) the device behavior is. A comparison of FIG. 8 versus FIG. 9 is evidence that interpolation using FIG. 9 is inherently more accurate.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 5:
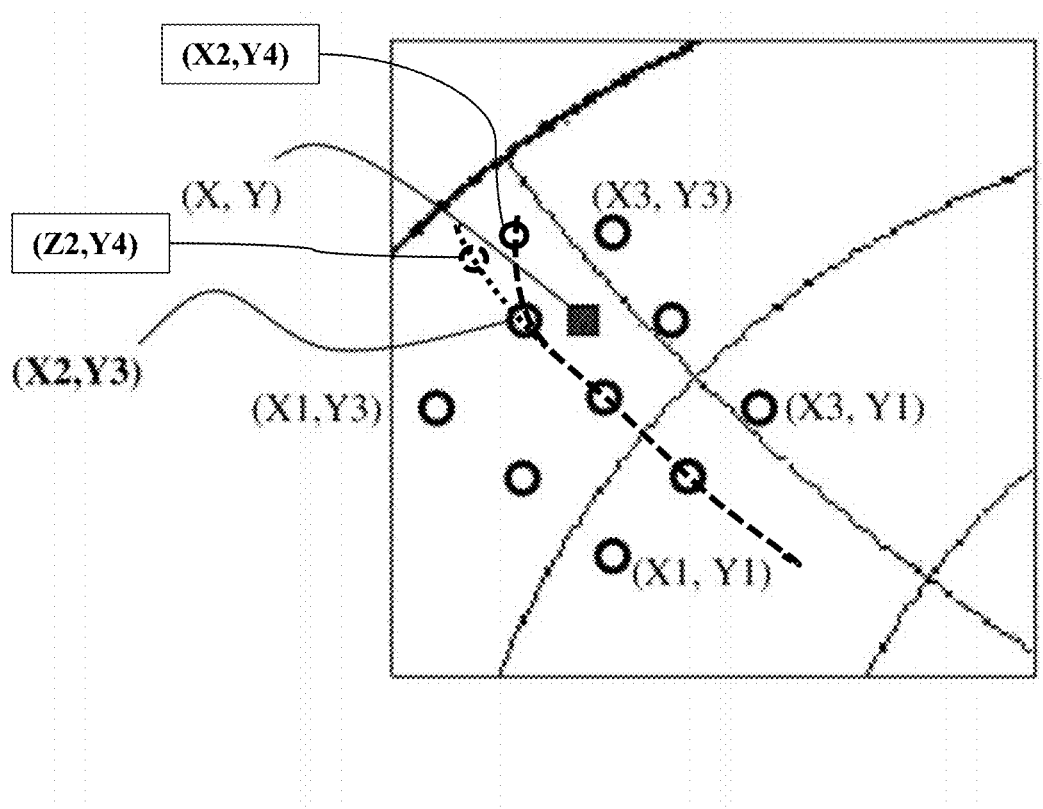
FIG. 5 depicts a detail of original and corrected reflection factor trajectories of a tuning probe for two horizontal tuning probe positions.

This invention discloses a calibration method for vertically moving tuning probes of slide screw impedance tuners. The method is agnostic. It adapts automatically to the type of tuner and the calibration frequency. It uses a new probe control coordinate system, which replaces the traditional Cartesian X,Y control system. Interpolation and tuning algorithms of the tuner managing software remain the same, albeit using the new coordinate system. The trace unskewing obtained using the method increases the accuracy of interpolation and tuning and reduces the requirement for high density calibration points close to $|\Gamma|=1$, otherwise required to piecewise linearize the calibration trajectories (FIG. 5).

Figure 10:
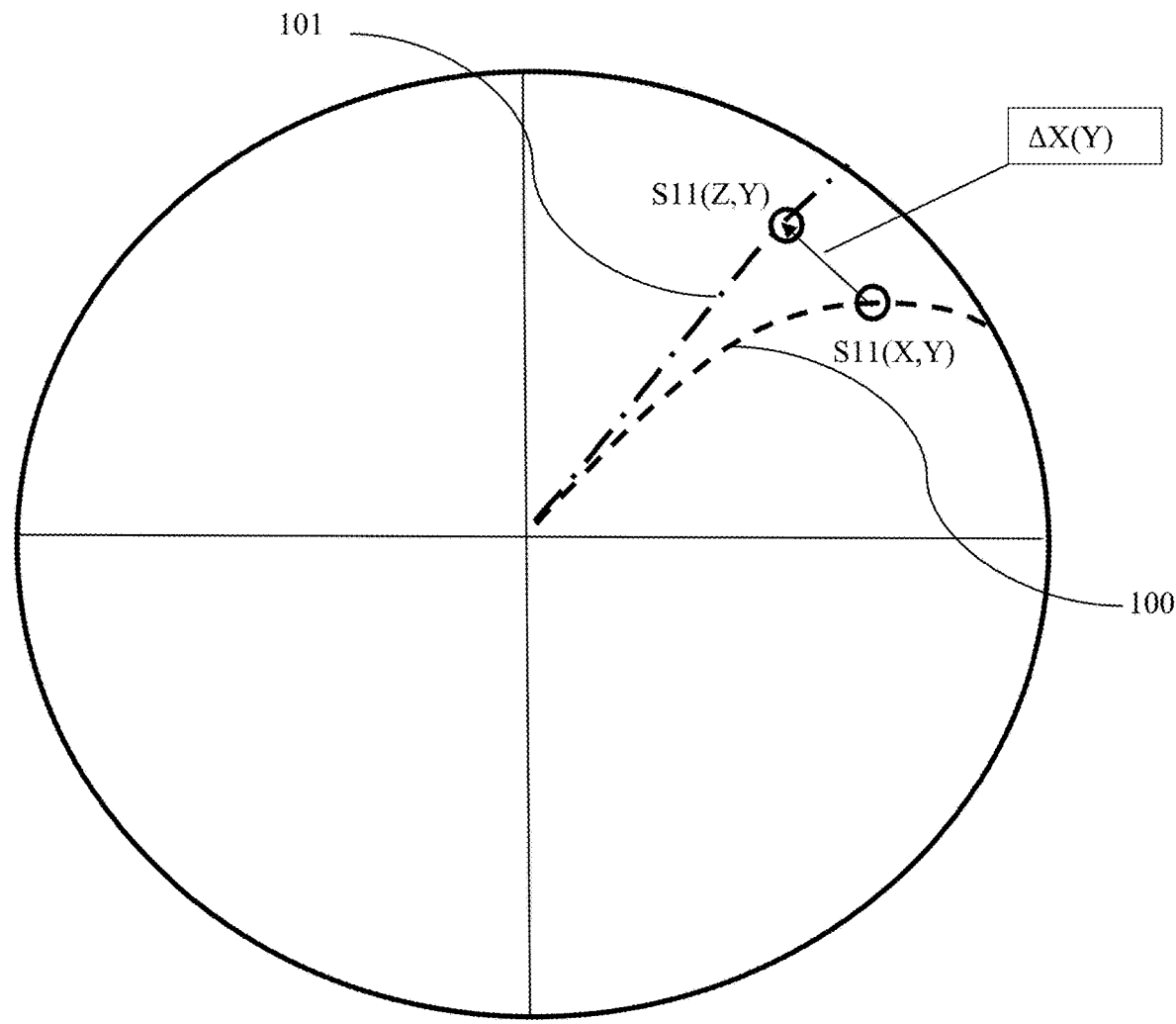
FIG. 10 depicts the skewing compensation mechanism.

The proposed mechanism for compensating the phase skewing at any fixed frequency F, created at high proximity of the tuning probe to the center conductor, FIG. 10, item 100, includes a different "scaling" procedure from the one described in ref. 4, column 5, lines 1-15. This includes the following steps (FIG. 6): in a first step 60 the tuner is connected to a pre-calibrated vector network analyzer (VNA), the calibration parameters and allowable phase drift are defined 61; then the RF probe is withdrawn and initialized horizontally 62 at sufficient electrical distance X0 from the test port, which depends on the test frequency F; this electrical distance (read physical distance, since the slabline is an airline, thus ($\lambda_0=\lambda(\varepsilon_r=1)$), X0 is determined by running a few trials and varies with frequency, but it is constant along the slabline; the only critical action here is to place the tuning probe far enough from the test port along the slabline, so as not to hit any mechanical limit switch when determining a reverse move, when compensating for the skewing: we therefore have an additional parameter to the prior art calibration to consider, the minimum distance from a physical limit switch closest to the test port, called X0=X0(F).

Then the tuning probe is remotely inserted gradually into the slot of the slabline of the tuner 67 while the reflection factor S11=|S11|*exp(jΦ11) is measured on the VNA at the tuner's test port inside the loop 66, to reach the next reflection factor level N/NC, wherein N=1, 2, 3 ... NC, and where NC is the user-defined number of concentric cercles of the calibration FIG. 4, see ref. 5; tolerance criteria for the change in Φ11 are entered as ΔΦ, 61 and verified during the insertion process. If Φ11 deviates (drifts away) from the target value, the probe is moved horizontally by ΔX, 64, while measuring S11, to compensate for this drift. Once the phase Φ11 is within the tolerances Φ11±ΔΦ/2 the position Z=X+ΔX,Y of the RF tuning probe is saved for reflection factors at predetermined levels 63 in several (typically NC=10 to NC=20) equal steps between 0, when the probe is withdrawn, and maximum reflection close to 1 on a Smith chart, when the probe is at its maximum penetration; the saved vertical positions thus correspond to |S11| values of 0.1, 0.2, 0.3 ... 0.9, or 0.05, 0.1, 0.15 ... 0.95 etc. (loop 63) The marked positions and associated |S11| values are saved in a data array in memory to be used immediately after; this first anti-skewing step procedure is called "vertical scaling".

Figure 6:
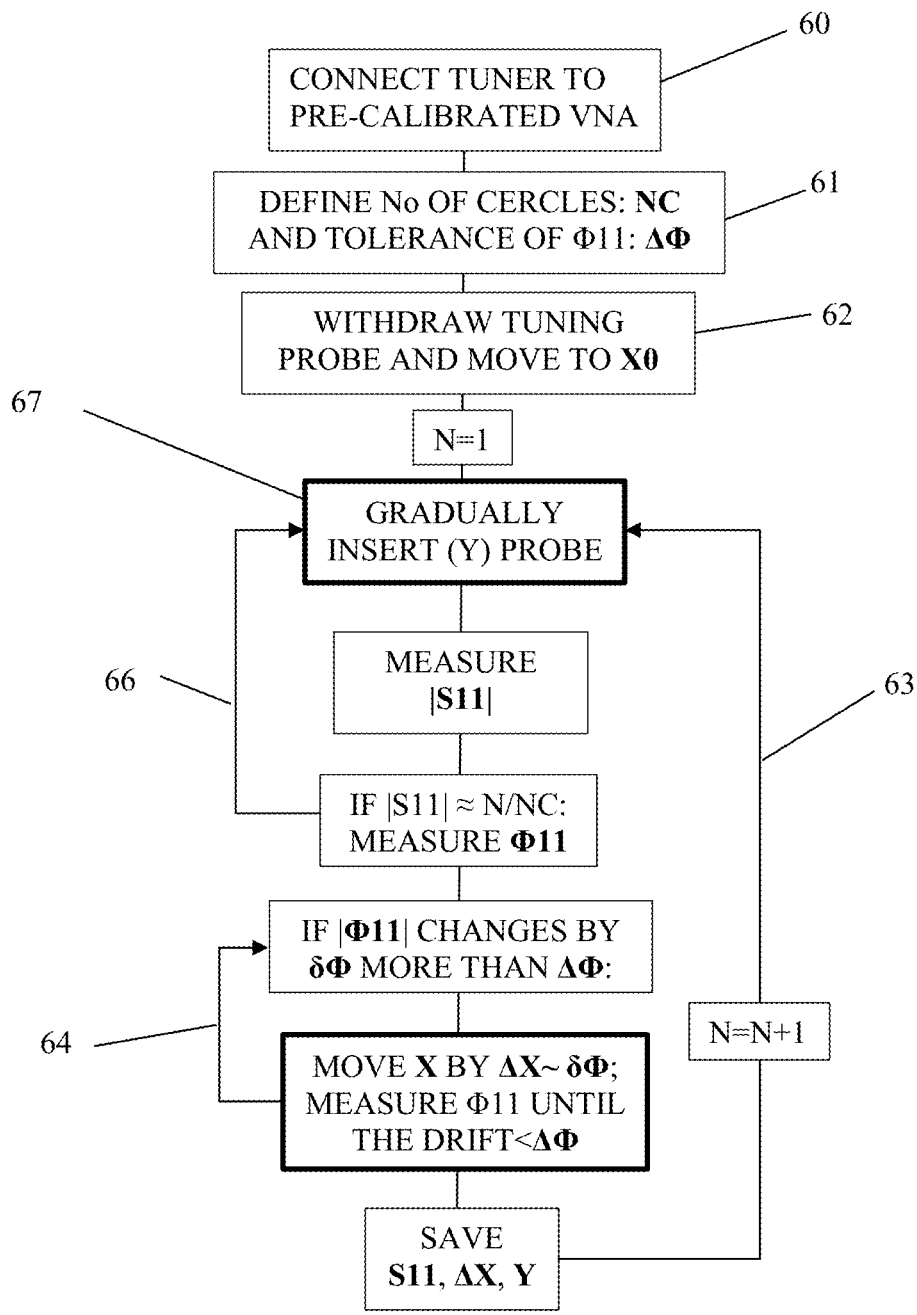
FIG. 6 depicts flowchart of anti-skewing scaling procedure.
Figure 11:
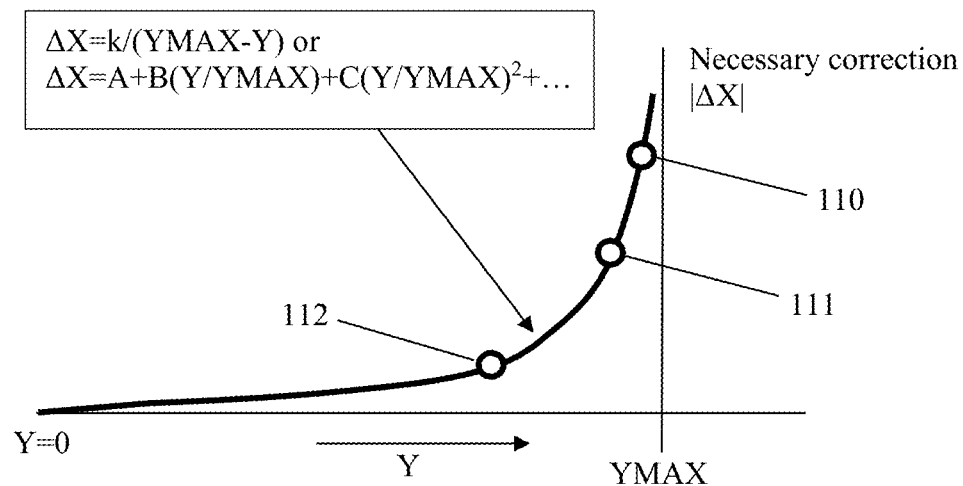
FIG. 11 depicts the anti-skewing correction as a function of probe insertion.

The anti-skewing scaling correction mechanism becomes clear in viewing FIG. 10: uncorrected vertical scaling trajectory 100 is straightened into trajectory 101 through horizontal ΔX(Y) displacement of the tuning probe, the size of which depends on the probe penetration Y in FIG. 11. This ΔX(Y) is determined by the new scaling procedure (FIG. 6).

Figure 7:
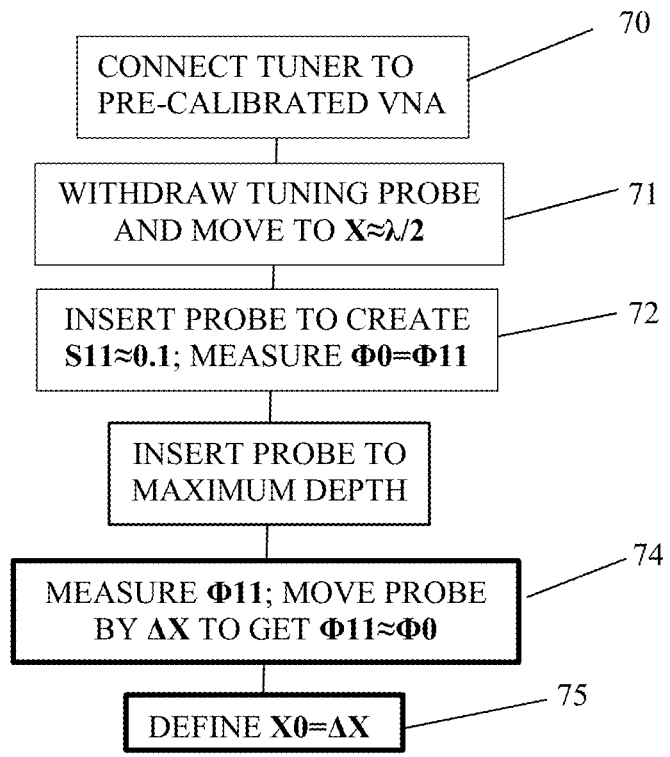
FIG. 7 depicts flowchart of maximum anti-skewing horizontal correction.

The maximum offset distance X0 is determined as follows (FIG. 7): after the tuner has been connected to a pre-calibrated VNA 70 then: first the tuning probe is withdrawn and moved approximately λ/2 along the slabline 71; there the probe is inserted slightly into the slot of the slabline, until the reflection factor S11 at the test port reaches approximately 0.1, at which time we measure the phase Φ11 and set (Φ0=(Φ11, 72. Then we insert the tuning probe further into the slot of the slabline until maximum depth YMAX, close before galvanic contact with the center conductor; if the phase Φ11 changes, we measure it and move the probe horizontally by a distance ΔX such that Φ11 becomes again equal to Φ0, 74. This is then X0: X0=ΔX, 75. The valid assumption here is that maximum skewing occurs at maximum probe penetration (FIG. 10). From now on the starting point of horizontal travel is X0: Z0=X0; Z(X,Y)=X0+X+ΔX(Y). The actual distance ΔX recovering the phase skewing depends on the penetration Y but cannot exceed X0, which is defined for each specific frequency using the algorithm of FIG. 7.

In a second step of the calibration, the saved positions (Z(Y),Y) with Z=X0+X+ΔX(Y) of the reflective tuning probe are used to position the probe at various horizontal distance Z from the test port and depths Y inside the slabline; the probe is moved in equal steps along the slabline over a total length of half a wavelength λ/2 at the test frequency F, in order to create concentric reflection factor circles on the Smith chart and cover 360° of reflection factor angle (FIG. 4); the movement steps of the RF probe are chosen such as to generate a sufficient amount of approximately equidistantly space-distributed (spread) reflection factors on the Smith chart; a simple method to do so is to increase the number of points (NP) on each concentric circle as the radius of the reflection factor increases following a simple rule, such as NP=N0*|S11|, where N0 increases from 80 to 160 as the Radius |S11| increases from 0.1 to ≈1.0; this means for |S11|=0.1 NP varies between 8 and 16 and for |S11|≈1, NP varies between 80 and 160. This translates to angular distance between 360/8=45° or 360/16=22.5° at |S11|≈0.1 and 360/80=4.5° or 360/160=2.25° at |S11|≈1.

Figure 1:
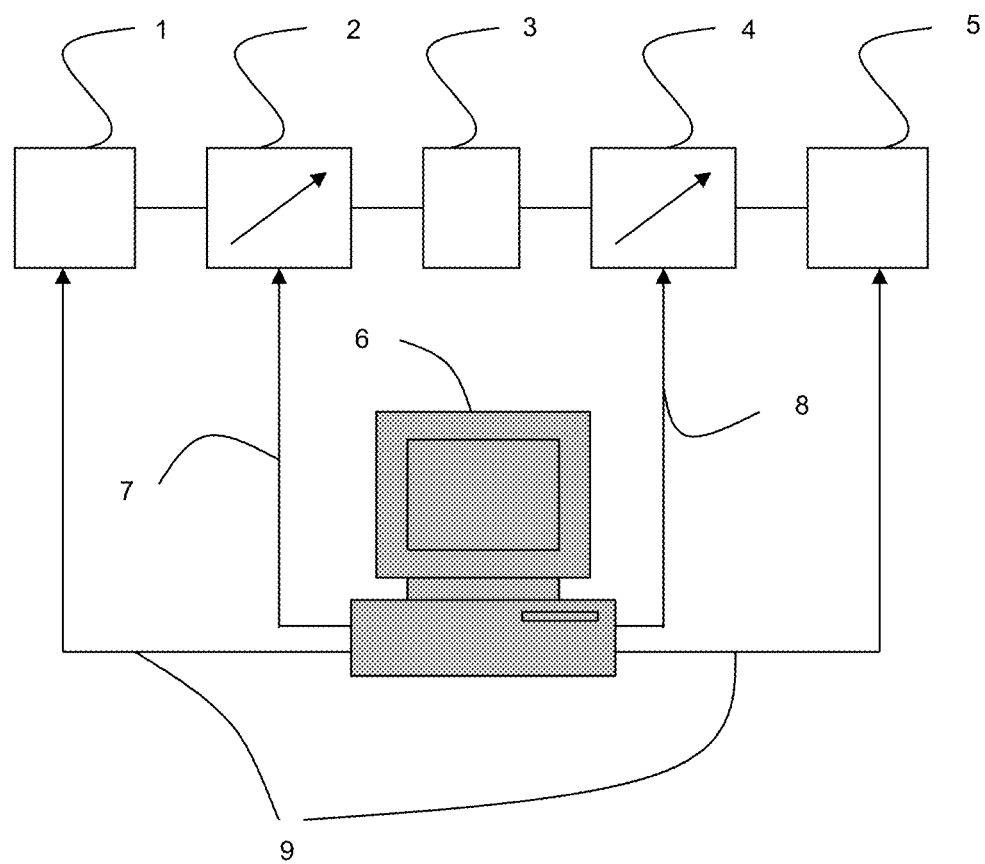
FIG. 1 depicts prior art, a typical automated transistor load pull test system.
Figure 2:
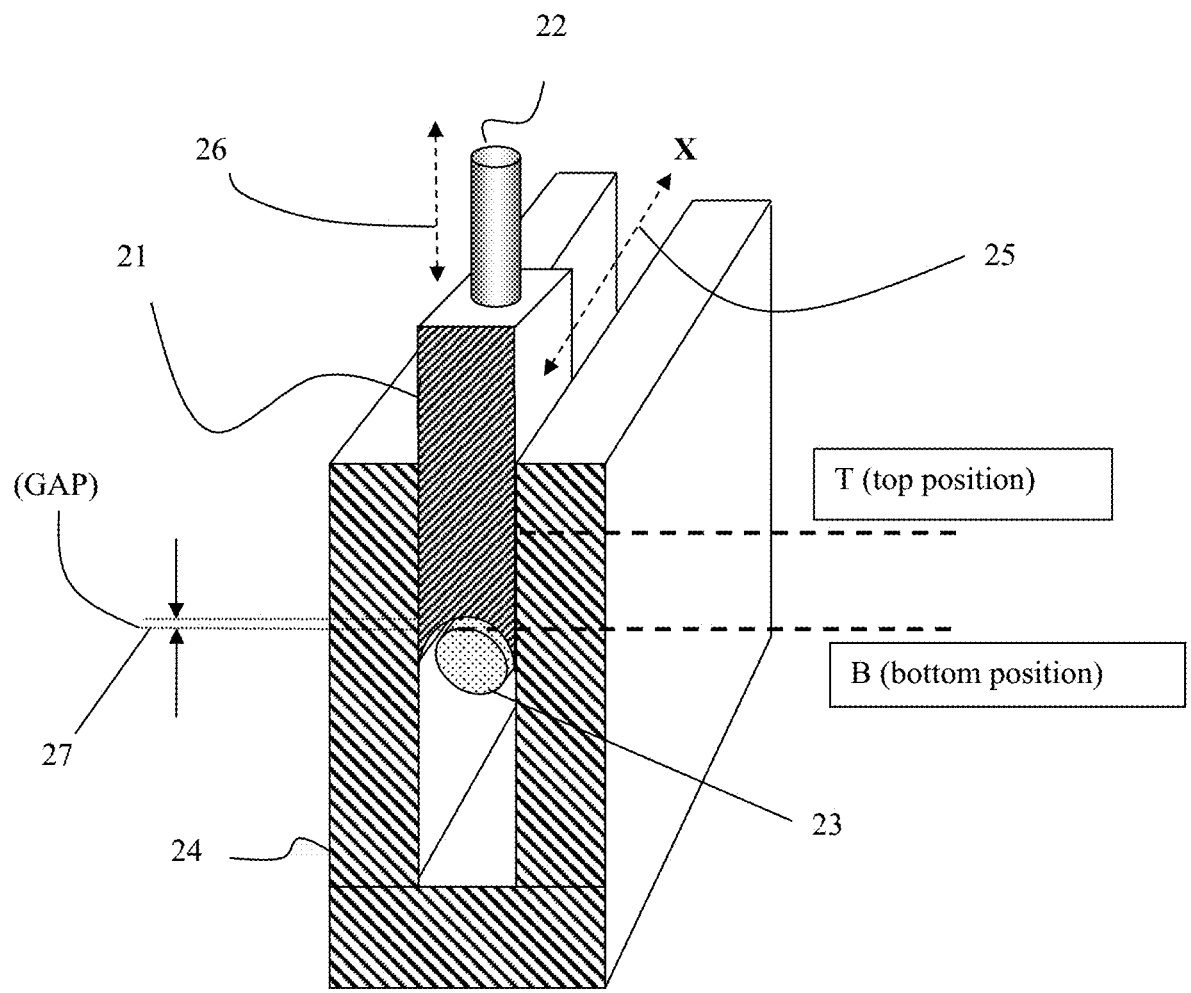
FIG. 2 depicts prior art, a perspective view and relevant dimensions and parameters of the operation of a tuning probe (slug).
Figure 3:
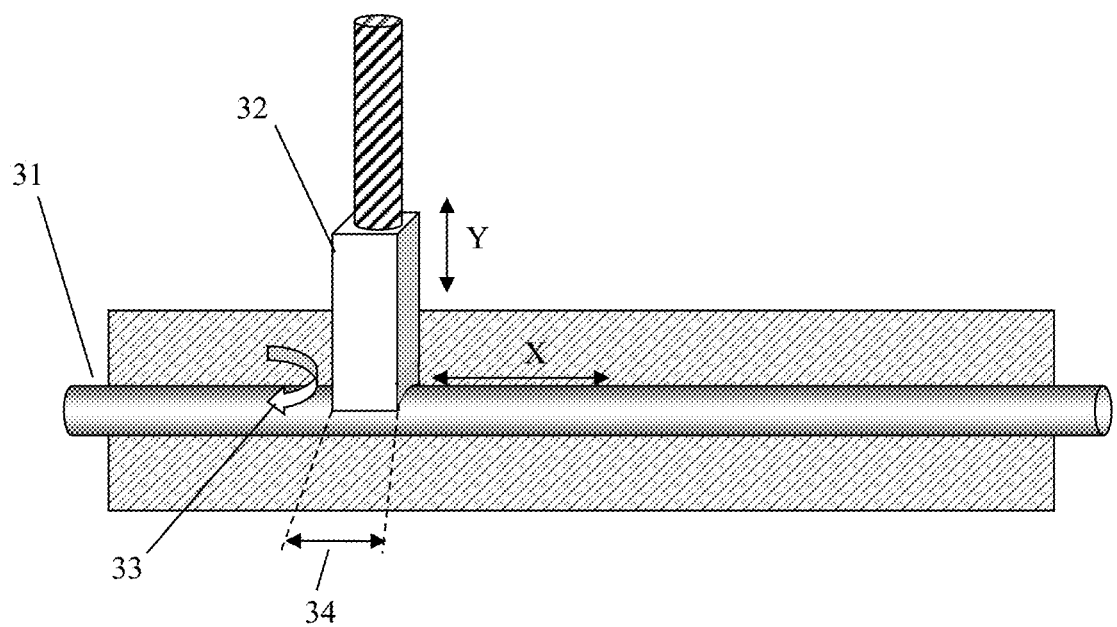
FIG. 3 depicts prior art, the vertical tuning probe (slug).
Figure 4:
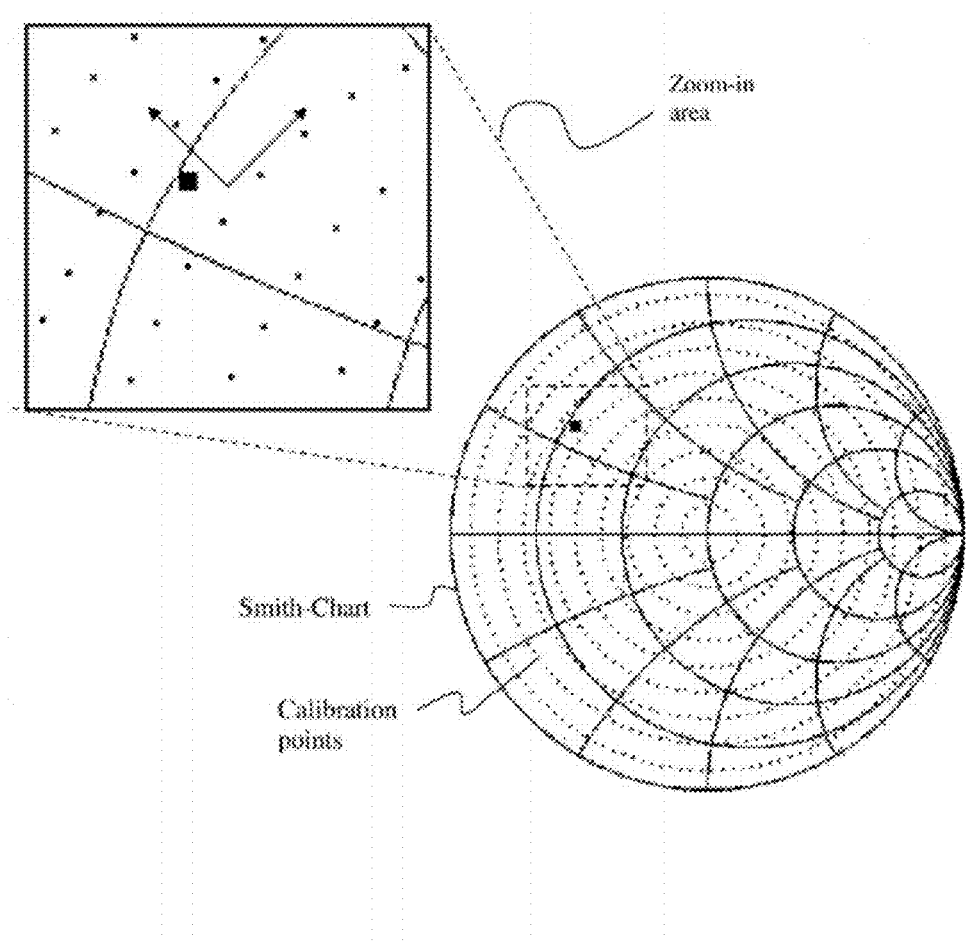
FIG. 4 depicts prior art, calibration points of slide screw tuner using a slug shaped probe.

For each re-positioning of the RF tuning probe full two-port s-parameters of the tuner are measured on the network analyzer and saved in a tuner calibration file for the test frequency F in the format [X, Y, ΔX, Sij] for {i,j}={1,2}; since all remote control is through stepper motors, all dimensions are expressed and all calculations are executed only in motor steps and not in mm or degrees. The translation control gears used, define each time the actual physical position of the tuning probe, but for the entire operation it is irrelevant. If, for instance 1.8° stepper motors are used and 2:1 reducing gear, then 200 motor steps cause 180° rotation or 0.9° per motor step. In X and Y direction a motor step can be converted from 1.5 µm to 25 µm physical probe movement typically, by selecting the parameters of the control gear (lead screw pitch and pulley diameter) to match for any frequency and wavelength. This procedure yields a distribution of calibrated points (S11) on the Smith chart, at any frequency as shown in FIG. 4.

Figure 8:
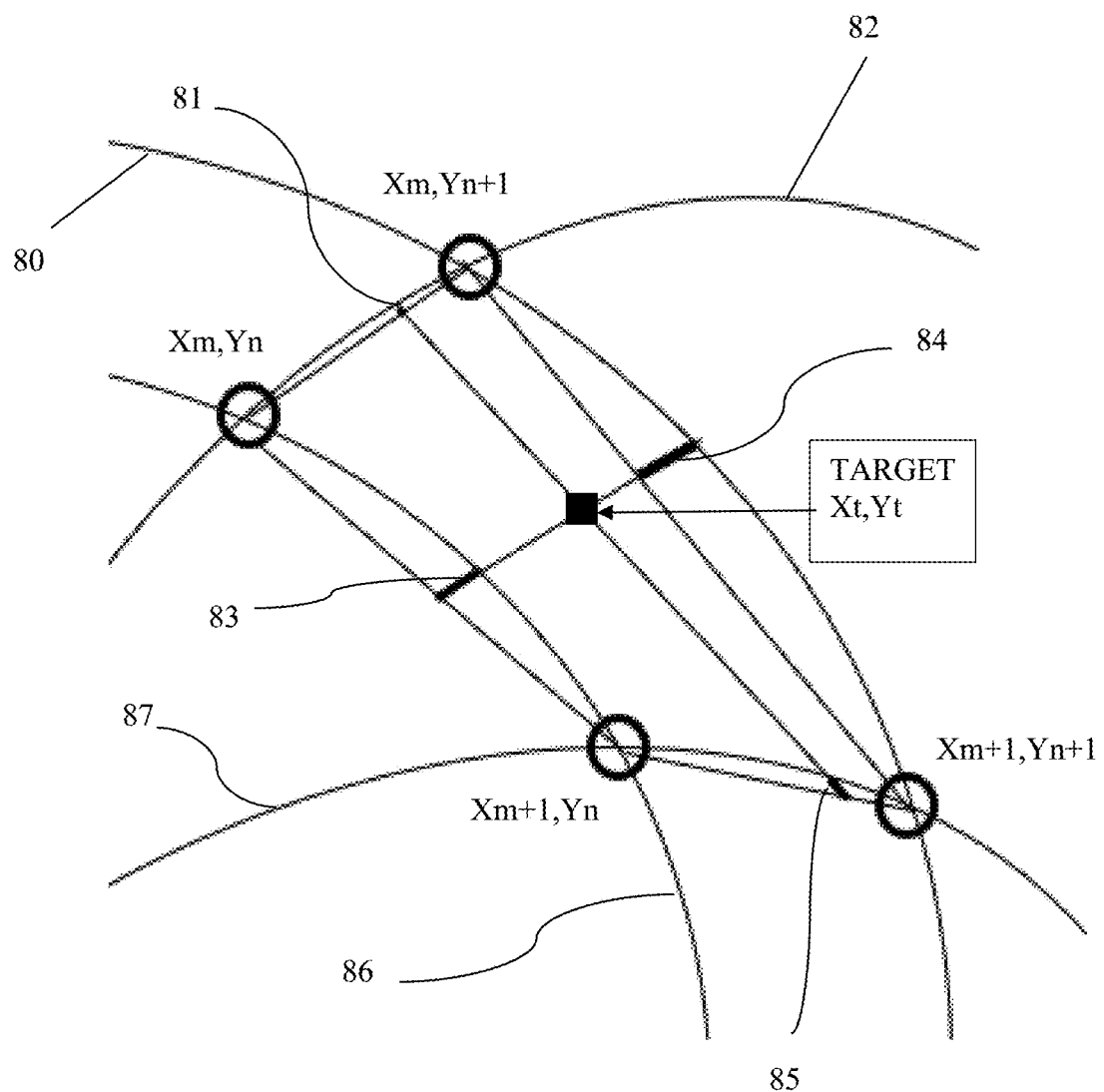
FIG. 8 depicts prior art, the interpolation error caused by the skewing effect.
Figure 9:
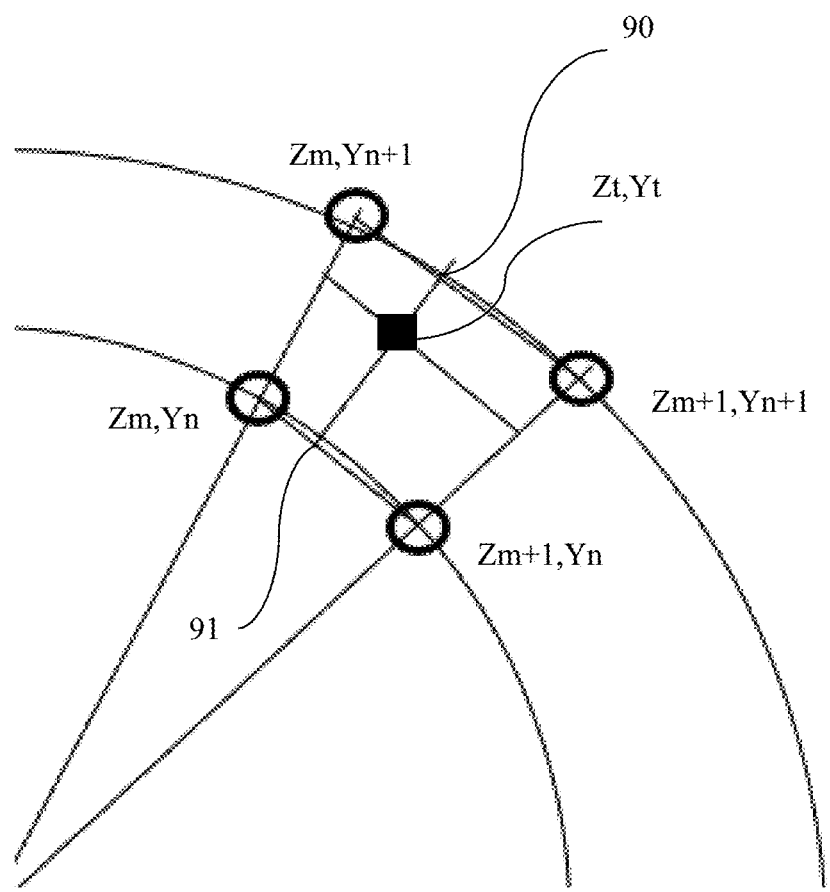
FIG. 9 depicts the improved interpolation behavior of the anti-skew calibration.

Upon retrieval of the s-parameters from the calibration file an interpolation algorithm is required to allow computing s-parameters of the tuner two-port at any of possible RF tuning probe's positions not included in the grid of already measured and saved calibration anchoring points in the calibration data file. Because of the linearized behavior of the reflection factor trajectory, a simple linear interpolation is adequate, as shown in FIG. 9, where the expected interpolation errors 81, 85 and 83, 84 in FIG. 8, created by calculating a trapezoid of the crossing of trajectories 80 and 86 with trajectories 82 and 87 are reduced to 90, 91 in FIG. 9; selecting the four adjacent closest calibrated points at tuning probe positions (Zm,Yn), (Zm+1,Yn), (Zm,Yn+1) and (Zm+1,Yn+1) to a target probe position (Zt,Yt) with $Zm \leq Zt < Zm+1$ and $Yn \leq Yt < Yn+1$; calculating s-parameters Sij(Zt,Yt) as follows:

$$Re(Sij(Zt,Yt)) = Re(Sij(Zm,Yn)) + (Re(Sij(Zt,Yt) - Sij(Zm,Yn)))/(Re(Sij(Zm+1,Yn) - Sij(Zm,Yn))); \quad \{eq.1\}$$

$$Im(Sij(Zt,Yt)) = Im(Sij(Zm,Yn)) + (Im(Sij(Zt,Yt) - Sij(Zm,Yn)))/(Im(Sij(Zm+1,Yn) - Sij(Zm,Yn))); \quad \{eq.2\}$$

for $\{i,j\} = \{1,2\}$.

If the anchoring calibration points Zm and Zm+1 in eq. 1 and 2 are not part of the values registered during scaling, an additional interpolation step will be required for $\Delta X(Y)$ enhancing the simplified linear, first-degree interpolation of equations {1} and {2} describing the dependence of $\Delta X(Y)$ per FIG. 11; the dependence of $\Delta X$ from Y can be either based on a single coefficient k in the relation $\Delta X = k/(YMAX-Y)$ {eq. 3} using a single value $\Delta X$, item 110, or in form of a second or third degree polynomial $\Delta X = A + B*Y/YMAX + C*(Y/YMAX)^2 \ldots$ {eq. 4} using items 110, 111, 112 from the values $\Delta X(Y)$ measured during the scaling procedure and applying commonly available best curve-fitting techniques. In general, the polynomial solution is more flexible and adaptable to various tuning probe behaviors and frequencies.

The concept of using a new coordinate system for calibrating slide screw impedance tuners for better interpolation and tuning accuracy has been presented. The method is agnostic both regarding tuner type and frequency. Obvious alternatives, in particular attempts to replace direct scaling with numerical approximations, are imaginable but shall not impede on to the general validity of the present invention.

What is claimed is:

1. An anti-skewing calibration method for slide screw impedance tuners at a frequency F comprising:
a scaling procedure,
a calibration procedure, and
an interpolation routine,
wherein,
the slide screw impedance tuners comprise:
a slabline having a horizontal center conductor linking a test port and an idle port, and at least one reflective tuning probe, remotely movable horizontally along the slabline and insertable vertically into the slabline between two extreme positions, a first extreme position corresponding to complete withdrawal from the slabline (vertical position Y=0) and a second extreme position closest to and immediately before mechanical contact with the center conductor (vertical position Y=YMAX),
and wherein
the scaling procedure comprises the following steps:
a) connect the tuner to a pre-calibrated vector network analyzer,
b) withdraw the reflective tuning probe from the slabline and place it at a distance X0 smaller than half a wavelength ($\lambda/2$) at the frequency F from the test port, along the slabline,
c) in a positioning-measuring loop:
c1) gradually inserting the reflective tuning probe into the slabline to a multitude of vertical penetration positions Y and measuring a reflection factor amplitude |S11(Y)| and phase $\Phi 11(Y)$ at the tuner test port, and
c2) for each penetration position Y, modifying the horizontal position of the reflective tuning probe along the slabline by a distance $\Delta X(Y)$ to keep the phase $\Phi 11(Y)$ constant within a pre-determined tolerance, and
c3) saving scaling data |S11(Y)|, $\Delta X(Y)$, Y;
and wherein
the calibration procedure comprises:
d) retrieving the scaling data from the scaling procedure, and in a positioning-measuring loop:
d1) place the reflective tuning probe at the multitude of penetration positions Y and
in a nested positioning-measuring loop:
position the reflective tuning probe to a multitude of horizontal positions $Z = X0 + X + \Delta X(Y)$ along the slabline for $0 \leq (X + \Delta X(Y)) \leq \lambda/2 + \Delta X(Y)$, measure calibration s-parameters Sij(Z,Y) for $\{i,j\} = \{1,2\}$ of the tuner and save;
and wherein
the interpolation routine comprises:
calculating s-parameters at a target reflection factor as a linear interpolation between s-parameters associated with four adjacent calibrated reflection factor points S11(Z,Y) forming four corners of a trapeze including the target reflection factor.

2. The anti-skewing calibration method for slide screw impedance tuners of claim 1, wherein
a horizontal distance X0 of the reflective tuning probe from the test port is at least ensuring that the phase $\Phi 11$ at the maximum penetration of the reflective tuning probe Y=YMAX is approximately equal to the phase $\Phi 11$ at low penetration of the tuning probe.

3. The interpolation routine of the anti-skewing calibration method of claim 1 comprising: given a target position (Zt,Yt) of the reflective tuning probe, select the four adjacent calibrated points Zm, Yn), (Zm+1,Yn), (Zm,Yn+1) and (Zm+1,Yn+1) surrounding the target probe position (Zt,Yt), with $Zm \leq Zt < Zm+1$ and $Yn \leq Yt < Yt+1$, and calculate s-parameters Sij (Zt,Yt) as follows:

$$Re(Sij(Zt,Yt)) = Re(Sij(Zm,Yn)) + (Re(Sij(Zt,Yt) - Sij(Zm,Yn)))/(Re(Sij(Zm+1,Yn) - Sij(Zm,Yn)));$$

$$Im(Sij(Zt,Yt)) = Im(Sij(Zm,Yn)) + (Im(Sij(Zt,Yt) - Sij(Zm,Yn)))/(Im(Sij(Zm+1,Yn) - Sij(Zm,Yn)));$$

for $\{i,j\} = \{1,2\}$.

* * * * *